United States Patent
Qian et al.

(10) Patent No.: US 10,672,491 B2
(45) Date of Patent: Jun. 2, 2020

(54) SHIFT REGISTER, ARRAY SUBSTRATE AND DISPLAY DEVICE

(71) Applicants: BOE Technology Group Co., Ltd., Beijing (CN); Hefei Xinsheng Optoelectronics Technology Co., Ltd., Hefei (CN)

(72) Inventors: Xianrui Qian, Beijing (CN); Bo Li, Beijing (CN)

(73) Assignees: Boe Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 178 days.

(21) Appl. No.: 15/770,798

(22) PCT Filed: Nov. 3, 2017

(86) PCT No.: PCT/CN2017/109287
§ 371 (c)(1),
(2) Date: Apr. 25, 2018

(87) PCT Pub. No.: WO2018/166215
PCT Pub. Date: Sep. 20, 2018

(65) Prior Publication Data
US 2019/0139616 A1 May 9, 2019

(30) Foreign Application Priority Data
Mar. 17, 2017 (CN) .......................... 2017 1 0161291

(51) Int. Cl.
*G11C 19/00* (2006.01)
*G11C 19/28* (2006.01)
(Continued)

(52) U.S. Cl.
CPC .............. *G11C 19/28* (2013.01); *G09G 3/20* (2013.01); *G09G 3/3677* (2013.01);
(Continued)

(58) Field of Classification Search
None
See application file for complete search history.

(56) References Cited

U.S. PATENT DOCUMENTS 7,436,923 B2 * 10/2008 Tobita .................. G09G 3/3677
377/64
8,149,986 B2 * 4/2012 Tobita .................... G11C 19/28
377/64
(Continued)

FOREIGN PATENT DOCUMENTS

CN        101952875 A    1/2011
CN        102432356 A    7/2011
(Continued)

OTHER PUBLICATIONS

International Search Report for PCT Application PCT/CN2017/109287 dated Jan. 26, 2018.

*Primary Examiner* — Tuan T Lam
(74) *Attorney, Agent, or Firm* — Fay Sharpe LLP

(57) ABSTRACT

A shift register, an array substrate and a display device in the field of display technology are provided in the present disclosure. In the shift register, the gate electrode of the first transistor is connected to a second node, one of the source electrode and the drain electrode is connected to a first clock signal line, and the other one is connected to the first node. The gate electrode of the second transistor is connected to the second node, one of the source electrode and the drain electrode is connected to the second node, and the other one is connected to the first clock signal line. The charging circuitry is configured to set the second node to an effective level when a second clock signal line is at an effective level. The memory circuitry is configured to store the threshold voltage of the second transistor and compensate the threshold voltage of the first transistor with the stored threshold voltage.

20 Claims, 5 Drawing Sheets

(51) Int. Cl.
  *G09G 3/20* (2006.01)
  *G09G 3/36* (2006.01)
(52) U.S. Cl.
  CPC .............. *G09G 2300/0408* (2013.01); *G09G 2310/0267* (2013.01); *G09G 2310/0286* (2013.01); *G09G 2310/08* (2013.01); *G09G 2320/043* (2013.01)

(56) References Cited

U.S. PATENT DOCUMENTS

| | | | |
|---|---|---|---|
| 8,816,949 B2* | 8/2014 | Tobita | G09G 3/3677 345/92 |
| 2008/0101529 A1 | 5/2008 | Tobita | |
| 2008/0226013 A1* | 9/2008 | Deane | G11C 19/00 377/70 |
| 2010/0111245 A1* | 5/2010 | Tobita | G11C 19/184 377/64 |
| 2013/0222352 A1* | 8/2013 | Jeong | G09G 3/3266 345/205 |
| 2017/0200418 A1* | 7/2017 | Zhang | G11C 19/28 |
| 2017/0287388 A1* | 10/2017 | Ma | G09G 3/20 |
| 2018/0082629 A1* | 3/2018 | Wang | G09G 3/20 |
| 2018/0211716 A1* | 7/2018 | Ma | G09G 3/20 |
| 2018/0233208 A1* | 8/2018 | Feng | G09G 3/20 |
| 2018/0240529 A1* | 8/2018 | Wang | G11C 19/28 |
| 2018/0322820 A1* | 11/2018 | Yang | G09G 3/20 |

FOREIGN PATENT DOCUMENTS

| | | |
|---|---|---|
| CN | 102667909 A | 9/2012 |
| CN | 105096836 A | 11/2015 |
| CN | 106023946 A | 10/2016 |
| CN | 106128347 A | 11/2016 |
| CN | 106652882 A | 5/2017 |

\* cited by examiner

US 10,672,491 B2

SHIFT REGISTER, ARRAY SUBSTRATE AND DISPLAY DEVICE

This application is a 371 of PCT Patent Application Serial No. PCT/CN2017/109287 filed Nov. 3, 2017, which claims priority to Chinese Patent Application No. 201710161291.6, filed with the State Intellectual Property Office on Mar. 17, 2017 and titled "SHIFT REGISTER, ARRAY SUBSTRATE AND DISPLAY DEVICE," the entire contents of which are incorporated herein by reference.

TECHNICAL FIELD

The present disclosure relates to display technology, and more particularly to a shift register, an array substrate and a display device.

BACKGROUND

Comparing with the traditional technique, the Gate driver On Array (GOA) technology not only saves the cost but also realizes the symmetrical design on both sides of a display panel, without the bonding area and the wiring area (e.g., a fanout area) of a chip, and is thus in favor of realizing the design of a narrow bezel. At the same time, because the GOA technology may eliminate the chip bonding process in the line direction, it is greatly helpful to the overall production capacity and the improvement of yield.

In the GOA design, a first node which controls the signal output and a second node which controls signal resetting are arranged in a shift register. The second node is reset periodically by a clock signal via thin film transistors (TFT) connected in a diode form. Therefore, the TFT will be constantly in an on-off switching state under the action of the clock signal, and thus tends to result in a large threshold voltage drift, thereby affecting the electric potential of the second node and resulting in an abnormal output signal of this stage. The abnormal signal will be passed down via the cascading shift registers, resulting in a wide range of display disorder.

In order to solve this problem, voltage division or the like may be introduced to reduce the gate voltage of the TFT, to alleviate the threshold voltage drift and enhance the stability of the shift registers. However, the TFT which is configured to reduce the gate voltage is also connected with the clock signal, so there is still a problem of the threshold voltage drift, and as the long-term effect, the output signal will still be abnormal. That is, the above means may only alleviate the signal distortion to a certain extent but cannot solve the problem of the abnormal output signal.

SUMMARY

In a first aspect, the present disclosure provides a shift register. The shift register includes a first node configured to control signal resetting, and the shift register further includes: a first transistor, wherein the gate electrode of the first transistor is connected to a second node, one of the source electrode and the drain electrode of the first transistor is connected to a first clock signal line, and the other one is connected to the first node; a second transistor, wherein the gate electrode of the second transistor is connected to the second node, one of the source electrode and the drain electrode of the second transistor is connected to the second node, and the other one is connected to the first clock signal line; a charging circuitry connected to the second node and the second clock signal line and configured to set the second node to an effective level when the second clock signal line is at an effective level; and a memory circuitry connected to the second node and the first clock signal line and configured to store a threshold voltage of the second transistor and to compensate the threshold voltage of the first transistor with the stored threshold voltage. The first transistor and the second transistor have the same threshold voltage, and the first clock signal line and the second clock signal line are loaded with one of a positive-phase clock signal and an inverted-phase clock signal respectively.

In a possible implementation, the memory circuitry is configured to store the threshold voltage of the second transistor when the second node discharges the first clock signal line through the second transistor, and to compensate the threshold voltage of the first transistor with the stored threshold voltage when the first clock signal line changes the level at the first node through the first transistor.

In a possible implementation, during the same clock inversion process, the moment when an effective level is changed to an ineffective level on the second clock signal line is earlier than the moment when an ineffective level is changed to an effective level on the first clock signal line.

In a possible implementation, the memory circuitry comprises a first capacitor. A first terminal of the first capacitor is connected to the second node, and a second terminal of the first capacitor is connected to the first clock signal line.

In a possible implementation, the charging circuitry comprises a third transistor. The gate electrode of the third transistor is connected to the second clock signal line, one of the source electrode and the drain electrode of the third transistor is connected to the second clock signal line, and the other one is connected to the second node.

In a possible implementation, the shift register comprises an output terminal, a third node which controls the signal output, and the shift register further comprises: a fourth transistor, wherein the gate electrode of the fourth transistor is connected to the third node, one of the source electrode and the drain electrode of the fourth transistor is connected to the second clock signal line, and the other one is connected to the output terminal; and a second capacitor, wherein a first terminal of the second capacitor is connected to the third node, and a second terminal is connected to the output terminal.

In a possible implementation, the shift register further comprises an input terminal, a reset terminal, and the shift register further comprises: a fifth transistor, wherein a gate electrode of the fifth transistor is connected to the input terminal, one of the source electrode and the drain electrode of the fifth transistor is connected to the input terminal, and the other one is connected to the third node; a sixth transistor, wherein the gate electrode of the sixth transistor is connected to the reset terminal, one of the source electrode and the drain electrode of the sixth transistor is connected to the third node, and the other one is connected to an ineffective-level voltage line; and a seventh transistor, wherein the gate electrode of the seventh transistor is connected to the reset terminal, one of the source electrode and the drain electrode of the seventh transistor is connected to the output terminal, and the other one is connected to the ineffective-level voltage line.

In a possible implementation, the shift register further comprises: an eighth transistor, wherein a gate electrode of the eighth transistor is connected to the first clock signal line, one of the source electrode and the drain electrode of the eighth transistor is connected to the input terminal, and the other one is connected to the third node; and a ninth transistor, wherein a gate electrode of the ninth transistor is connected to the first clock signal line, one of the source electrode and the drain electrode of the ninth transistor is connected to the output terminal, and the other one is connected to the ineffective-level voltage.

In a possible implementation, the shift register comprises an output terminal, a third node which controls the signal output, and further comprises: a tenth transistor, wherein the gate electrode of the tenth transistor is connected to the first node, one of the source electrode and the drain electrode of the tenth transistor is connected to the third node, and the other one is connected to the ineffective-level voltage line; an eleventh transistor, wherein the gate electrode of the eleventh transistor is connected to the first node, one of the source electrode and the drain electrode of the eleventh transistor is connected to the output terminal, and the other one is connected to the ineffective-level voltage line; and a twelfth transistor, wherein the gate electrode of the twelfth transistor is connected to the third node, one of the source electrode and the drain electrode of the twelfth transistor is connected to the first node, and the other one is connected to the ineffective-level voltage line.

In a second aspect, the present disclosure provides an array substrate. The array substrate comprises any of the above shift registers.

In a third aspect, the present disclosure provides display device. The display device comprises a display panel and any of the above array substrates.

BRIEF DESCRIPTION OF THE DRAWINGS

To describe the technical solutions in the embodiments of the present disclosure more clearly, the following briefly introduces the enclosed drawings required for describing the embodiments. Apparently, the enclosed drawings in the following description show merely some embodiments of the present disclosure, and a person of ordinary skill in the art may still derive other drawings from these enclosed drawings without creative efforts.

DETAILED DESCRIPTION

The present disclosure will be described in further detail with reference to the enclosed drawings, to clearly present the objects, technical solutions, and advantages of the present disclosure.

Figure 1:
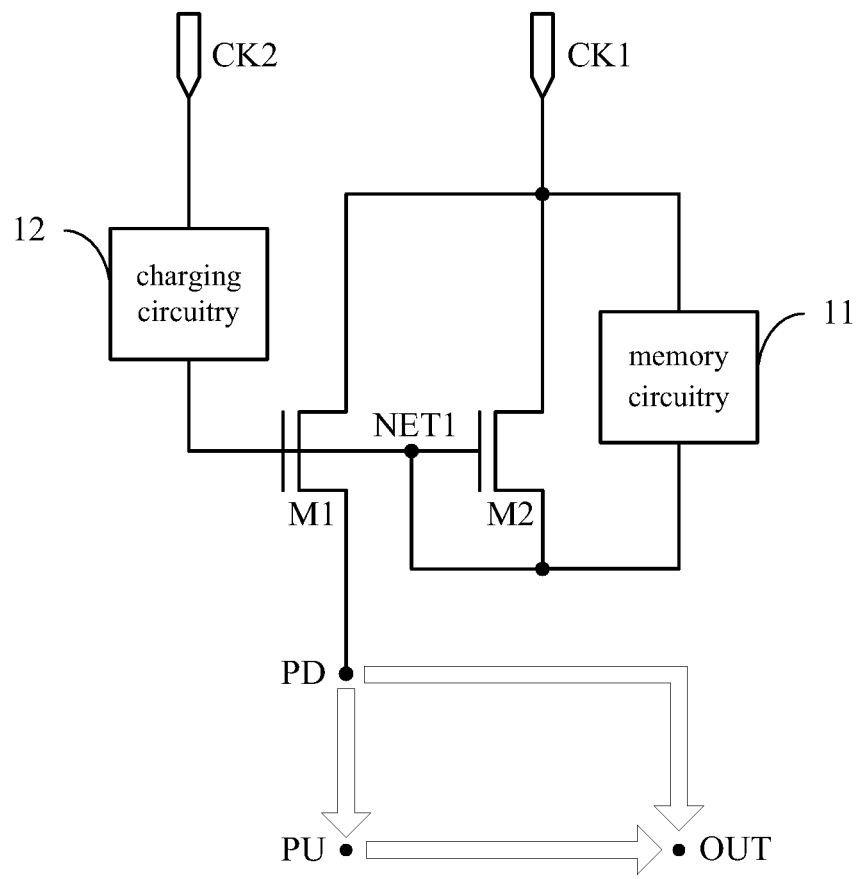
FIG. 1 is a block diagram of a shift register provided in an embodiment of the present disclosure.

FIG. 1 is a block diagram of a shift register provided in an embodiment of the present disclosure. Referring to FIG. 1, the shift register comprises an output terminal OUT, a third node PU which controls the signal output at the output terminal OUT, and a first node PD which controls the signal resetting at the output terminal OUT and at the third node PU. In an example, a high level and a low level at the third node PU may turn on and cut off the connection between the output terminal OUT and a high-level voltage line respectively, thereby realizing the control over the signal output. A high level and a low level at the first node PD may turn on and cut off the connection between the output terminal OUT and a low-level voltage line and the connection between the third node PU and the low-level voltage line respectively, thereby realizing the control over the signal resetting. In another example, the high level and the low level at the third node PU may turn on and cut off the connection between the output terminal OUT and a second clock signal line CK2 respectively, thereby realizing the control over the signal output in coordination with a clock signal on the second clock signal line CK2; the high level and the low level at the first node PD may turn on and cut off the connection between the output terminal OUT and the low-level voltage line respectively, thereby realizing the control over the signal resetting. During implementation, the third node PU may be configured with reference to a configuration of a third node which controls the signal output in the related art, and the first node PD may be configured with reference to a configuration of a first node which controls the signal resetting in the related art, which will not be specifically limited in the present embodiment. In an example, the "control signal output" refers to a process of controlling the shift register to output signals externally, and the "control signal resetting" refers to a process of controlling the shift register to return to a reset state from a state of outputting the signal externally.

Referring to FIG. 1, the shift register further comprises a first transistor M1, a second transistor M2, a memory circuitry 11 and a charging circuitry 12. Wherein, both the first transistor M1 and the second transistor M2 are N-type transistors with the same threshold voltage. That is, a current between the source electrode and the drain electrode may be formed when a gate electrode is connected to a high-level voltage. The gate electrode of the first transistor M1 is connected to a second node NET1, one of the source electrode and the drain electrode of the first transistor M1 is connected to the first clock signal line CK1, and the other one is connected to a first node PD. The gate electrode of the second transistor M2 is connected to the second node NET1, one of the source electrode and the drain electrode of the second transistor M2 is connected to the second node NET1, and the other one is connected to the first clock signal line CK1. Wherein, the first clock signal line CK1 and the second clock signal line CK2 are respectively loaded with one of a positive-phase clock signal CLK and an inverted-phase clock signal CLKB. It should be noted that a connection relationship of the source electrode and the drain electrode may be set in accordance with different types of transistors, so as to match the direction of the current flowing through the transistors. When the transistor has a structure in which the source electrode and the drain electrode are symmetrical, the source electrode and the drain electrode may be regarded as two electrodes which are not particularly distinguished.

The charging circuitry 12 is connected to the second node NET1 and the second clock signal line CK2 respectively and is configured to set the second node NET1 to a high level when the second clock signal line CK2 is at a high level. The memory circuitry 11 is connected to the second node NET1 and the first clock signal line CK1 respectively and is configured to store a threshold voltage of the second transistor M2 and to compensate a threshold voltage of the first transistor M1 with the stored threshold voltage. In an example, the memory circuitry 11 is configured to store the threshold voltage of the second transistor M2 when the second node NET1 discharges the first clock signal line CK1 through the second transistor M2 and to compensate the threshold voltage of the first transistor M1 with the stored threshold voltage when the first clock signal line CK1 pulls up an electric potential at the first node PD through the first transistor M1. In yet another example, both the first transistor M1 and the second transistor M2 are P-type transistors. The memory circuitry 11 is configured to store the threshold voltage of the second transistor M2 when the first clock signal line CK1 discharges the second node NET1 through the second transistor M2 and to compensate the threshold voltage of the first transistor M1 with the stored threshold voltage when the first clock signal line CK1 pulls down an electric potential at the first node PD through the first transistor M1.

It should be noted that the high level and the low level are the two preset potentials or the two preset potential ranges which are higher and lower with respect to each other and may be set in different manners at different circuit nodes by a person skilled in the art in accordance with application demands, which will not be limited in the present disclosure.

It may be seen that, since the gate electrodes of the first transistor M1 and the second transistor M2 are connected to the same signal and have the same threshold voltage (for example, a mirror structure or a symmetrical structure is used to make the structures and sizes of the two transistors exactly the same when the two transistors are manufactured), it may be considered that the threshold voltage drift conditions thereof are identical. Therefore, the memory circuitry 11 may be configured to store the threshold voltage of the second transistor M2 in coordination with the charging circuitry 12 so as to compensate the threshold voltage of the first transistor M1, such that the threshold voltage drift of the first transistor M1 will not affect the pull-up of the first node PD. Therefore, the effect of the threshold voltage drift of the transistor on the pull-down of the electric potential at the node may be eliminated helping to resolve the problem of the abnormal output signal.

Figure 2:
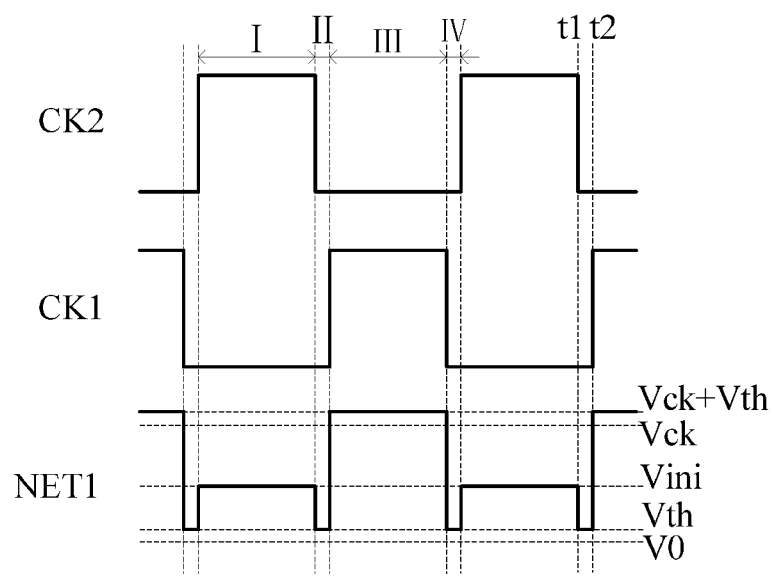
FIG. 2 is a circuit timing sequence diagram of the shift register provided in FIG. 1.

As an example, FIG. 2 is a circuit timing sequence diagram of the shift register shown in FIG. 1. Referring to FIG. 2, the first clock signal line CK1 is loaded with an inverted-phase clock signal with a duty ratio of less than 50%, and the second clock signal line CK2 is loaded with a positive-phase clock signal with a duty ratio of less than 50% (as an example, the duty ratio of the positive-phase clock signal and the duty ratio of the inverted-phase clock signal may both be 40%). In addition, during the same clock inversion process, the moment when a high level is changed to a low level on the second clock signal line CK2 is earlier than the moment when a low level is changed to a high level on the first clock signal line CK1. For example, in FIG. 2, the first moment t1 when a high level is changed to a low level on the second clock signal line CK2 is earlier than the second moment t2 when a low level is changed to a high level on the first clock signal line CK1, wherein the time from the first moment t1 to the second moment t2 is the process of clock inversion once. Referring to FIG. 1 and FIG. 2, based on the clock signals, the operating process of the shift register within a clock cycle is as follows.

In the first phase I, the first clock signal line CK1 is loaded with a low level. The second clock signal line CK2 is loaded with a high level. The charging circuitry 12 at this moment sets the second node NET1 to be at a high-level initial voltage Vini, such that both the first transistor M1 and the second transistor M2 are turned on. In this case, because the second transistor M2 is turned on, there is a current flowing from the second node NET1 to the first clock signal line CK1. Therefore, the second node NET1 in the first phase I may be maintained at the initial voltage Vini as a result of the dynamic balance between the electric potential pull-up action of the charging circuitry 12 and the electric potential pull-down action of the second transistor M2. It should be noted that the initial voltage Vini should be higher than the threshold voltage Vth of the first transistor M1 and the second transistor M2, such that the second node NET1 may reach a high level during the first phase I. As shown in FIG. 2, the initial voltage Vini in the present embodiment is higher than a low-level voltage V0 (i.e., the reference voltage of a circuit, which is set to be zero for convenience of description) of the clock signal and the threshold voltage Vth of the two transistors, and is lower than the high-level voltage Vck of the clock signal.

In the second phase II: the first clock signal line CK1 is still at a low level. The second clock signal line CK2 is changed from a high level to a low level. The charging circuitry 12 at this moment stops pulling up the second node NET1, such that the second node NET1 discharges the first clock signal line CK1 through the second transistor M2. In accordance with the device characteristics of the transistors, the discharging process will continue until the voltage at the second node NET1 is higher than the low-level voltage V0 on the first clock signal line CK1 by Vth. Therefore, the memory circuitry 11 may store the electric potential difference Vth between the second node NET1 and the first clock signal line CK1 at this time, for the compensation of the threshold voltage in a subsequent process.

In the third phase III: the second clock signal line CK2 is still at a low level. The first clock signal line CK1 is changed from a low level to a high level. The memory circuitry 11 at this moment may maintain the electric potential difference Vth between the second node NET1 and the first clock signal line CK1 to allow the second node NET1 to jump to a high-level voltage equal to Vck+Vth. Therefore, both the first transistor M1 and the second transistor M2 are turned on. The electric potential difference between the second node NET1 and the first clock signal line CK1 at this moment still remains at Vth, so the second transistor M2 will not form a current between the second node NET1 and the first clock signal line CK1. Since there is no inflow and outflow of the current, the second node NET1 remains at a high-level voltage with a magnitude equal to Vck+Vth in this stage.

As described above, in the third phase III, the first transistor M1 is turned on under the action of the high-level voltage of the second node NET1, and a current flowing from the first clock signal line CK1 to the first node PD may be formed. That is, the first clock signal line CK1 may pull up the electric potential at the first node PD through the first transistor M1. The magnitude of the pull-up current Ids may be expressed as:

$$Ids = \frac{\mu C_{ox}}{2} \frac{W}{L}(Vck+Vth-Vth)2 = \frac{\mu C_{ox}}{2} \frac{W}{L} Vck2,$$

in the formula, the carrier mobility $\mu$ and the capacitance $C_{ox}$ per unit area of the gate electrode insulating layer are generally determined by the forming material, the channel width ratio W/L is determined by an internal structure of the transistor, all of which may be regarded as constants here. Due to the mutual offset of the threshold voltages Vth, the pull-up current Ids is no longer related to the magnitude of the threshold voltage Vth of the first transistor M1 and the second transistor M2. That is, the threshold voltage of the first transistor M1 is compensated by the threshold voltage stored in the memory circuitry 11.

In the fourth stage IV: the second clock signal line CK2 is still at a low level. The first clock signal line CK1 is changed from a high level to a low level. The memory circuitry 11 at this moment may maintain the electric potential difference Vth between the second node NET1 and the first clock signal line CK1 to allow the second node NET1 to drop to a low-level voltage equal to Vth. It may be understood that, when entering the first phase I in the next clock cycle, the second node NET1 may be set to be at the initial voltage Vini under the action of the charging circuitry 12 again, thereby repeating the process from the first phase I to the fourth phase IV.

In a comparing example, the memory circuitry 11 is removed on the basis of the shift register. Thus, the operating process of the shift register mainly differs from the operating process of the shift register described above in that: the voltage of the second node NET1 in the third phase III is Vck instead of Vck+Vth. In this case, the pull-up current Ids flowing through the source electrode and the drain electrode of the first transistor M1 in the comparing example will be related to the magnitude of the threshold voltage Vth of the first transistor M1. As a result, the magnitude of the threshold voltage Vth of the first transistor M1 may change (the threshold voltage drift) along the time of the product usage, thereby affecting the pull-up of the first node PD. For example, if the pull-up current Ids is too low, the level at the first node PD may not reach a high level in the third phase III, and the signal resetting of the shift register may not be normally performed. A signal output from the shift register will be abnormal.

It may be seen that, based on a circuit structure formed by the second transistor M2, the memory circuitry 11 and the charging circuitry 12, in the embodiment of the present disclosure, the threshold voltage drift of the first transistor M1 will not affect the pull-up of the first node PD, by eliminating the effect brought by the threshold voltage of the first transistor M1 when the electric potential at the first node PD is pulled up by the first transistor M1. Therefore, the effect of the threshold voltage drift of the transistor on the pull-down of the electric potential at the node may be eliminated, and the problem of the abnormal output signal is solved. Comparing with the prior art, the embodiment of the present disclosure may improve the stability of the shift register and achieve a better product performance.

With regard to the circuit timing sequence shown in FIG. 2, it should be noted that: in order for the second node NET1 to be at the threshold voltage Vth before the third phase III, the duration of the second phase II needs to be no shorter than the time required for a process during which the second node NET1 drops from the initial voltage Vini to the threshold voltage Vth. Since the length of time required for this process is related to the magnitude (Vini-Vth), the material for forming the second transistor M2 and the structure of the second transistor M2, etc., the clock signals on the first clock signal line CK1 and the second clock signal line CK2 may be set in accordance with these factors (e.g., setting parameters including duty ratios) during implementation. Therefore, during the same clock inversion process, the time difference between the moment when a high level is changed to a low level on the second clock signal line and the moment when a low level is changed to a high level on the first clock signal line is longer than the time required for the second node to drop from the initial voltage to the threshold voltage, thereby further improving the stability of the shift register. However, it also takes time for the first clock signal line CK1 to change from a low level to a high level, and this time may be longer than the time required for the second node to drop from the initial voltage to the threshold voltage. Therefore, in this case, the positive-phase clock signal and the inverted-phase clock signal may be set to a duty ratio of 50% respectively and may be phase-inverted to each other strictly. Similarly, the processes described in the first stage I to the fourth stage IV may be realized.

Figure 3:
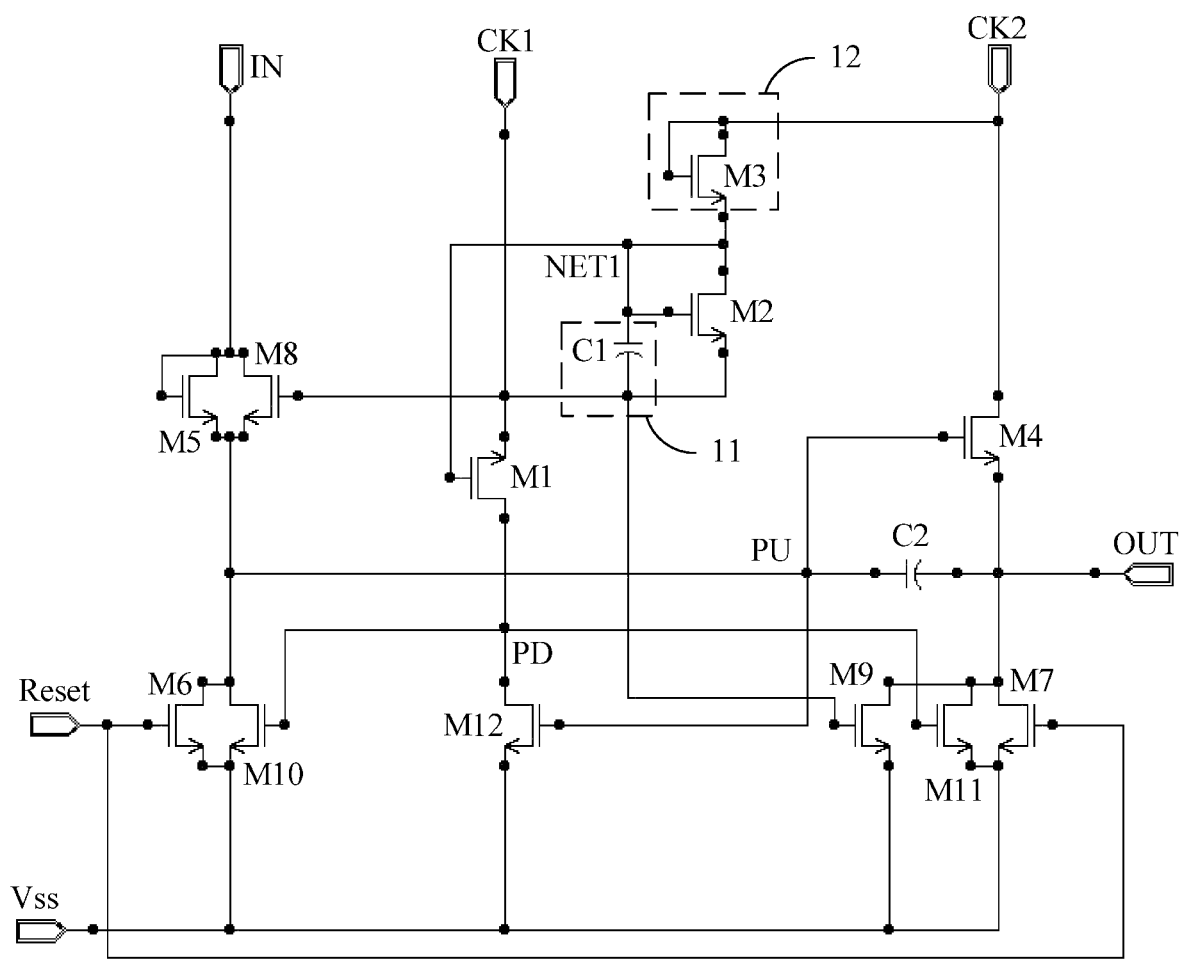
FIG. 3 is a circuit structure diagram of a shift register provided in an embodiment of the present disclosure.

FIG. 3 is a circuit diagram of a shift register in accordance with an embodiment of the present disclosure. Referring to FIG. 3, the shift register provided by the embodiment of the present disclosure not only has an output terminal OUT, but also has an input terminal IN and a reset terminal Reset. External signal lines include a low-level voltage line Vss in addition to the first clock signal line CK1 and the second clock signal line CK2.

Referring to FIG. 3, the memory circuitry 11 specifically comprises a first capacitor C1, wherein a first terminal of the first capacitor C1 is connected to the second node NET1, and a second terminal of the first capacitor C1 is connected to the first clock signal line CK1. Thus, the functions of the memory circuitry 11 may be realized by utilizing the properties of the capacitor which may store charges and whose voltages at both terminals may not change suddenly, which include: changing the voltages at both terminals to the initial voltage Vini by charging in the first phase; dropping the voltages at both terminals to the threshold voltage Vth by discharging in the second stage II; and maintaining the voltages at both terminals to the threshold voltage Vth in the third phase III.

Referring to FIG. 3, the charging circuitry 12 specifically comprises a third transistor M3. The gate electrode of the third transistor M3 is connected to the second clock signal line CK2, one of the source electrode and the drain electrode of the third transistor M3 is connected to the second clock signal line CK2, and the other one is connected to the second node NET1. Thus, the functions of the charging circuitry 12 may be realized by utilizing the transistors which are connected in a diode form, which including: setting the level at the second node NET1 to be the initial voltage Vini under the action of a high-level voltage on the second clock signal line CK2 in the first phase I; and cutting off the connection between the second clock signal line CK2 and the second node NET1 in the second phase II and the third phase III.

Referring to FIG. 3, the shift register further comprises a fourth transistor M4 and a second capacitor C2. The gate electrode of the fourth transistor M4 is connected to the third node PU, one of the source electrode and the drain electrode of the fourth transistor M4 is connected to the second clock signal line CK2, and the other one is connected to the output terminal OUT. A first terminal of the second capacitor C2 is connected to the third node PU, and a second terminal of the second capacitor C2 is connected to the output terminal OUT. Based on a circuit structure formed by the fourth transistor M4 and the second capacitor C2, the bootstrapped signal output under the control of the electric potential at the third node PU may be realized, which is favorable for improving the signal output quality and optimizing the circuit performance.

Referring to FIG. 3, the shift register further comprises a fifth transistor M5, a sixth transistor M6, and a seventh transistor M7. The gate electrode of the fifth transistor M5 is connected to the input terminal IN, one of the source electrode and the drain electrode of the fifth transistor M5 is connected to the input terminal IN, and the other one is connected to the third node PU. The gate electrode of the sixth transistor M6 is connected to the reset terminal Reset, one of the source electrode and the drain electrode of the sixth transistor M6 is connected to the third node PU, and the other one is connected to the low-level voltage line Vss. The gate electrode of the seventh transistor M7 is connected to the reset terminal Reset, one of the source electrode and the drain electrode of the seventh transistor M7 is connected to the output terminal OUT, and the other one is connected to the low-level voltage line Vss. Based on the fifth transistor M5, the third node PU may be pulled up under the control of the electric potential at the input terminal IN, that is, the signal input of the shift register may be realized. Based on a circuit structure formed by the sixth transistor M6 and the seventh transistor M7, the signal resetting at the third node PU and at the output terminal OUT under the control of the electric potential at the reset terminal Reset may be realized.

Referring to FIG. 3, the shift register further includes an eighth transistor M8 and a ninth transistor M9. The gate electrode of the eighth transistor M8 is connected to the first clock signal line CK1, one of the source electrode and the drain electrode of the eighth transistor M8 is connected to the input terminal IN, and the other one is connected to the third node PU. The gate electrode of the ninth transistor M9 is connected to the first clock signal line CK1, one of the source electrode and the drain electrode of the ninth transistor M9 is connected to the output terminal OUT, and the other one is connected to the low-level voltage line Vss. The eighth transistor M8 and the ninth transistor M9 are capable of setting the level at the third node and the level at the output terminal respectively as an ineffective levels when the first clock signal line is at an effective level, thereby using the first clock signal line CK1 to assist in pulling up the electric potential at the third node PU and resetting a signal at the output terminal OUT, in favor of reducing the signal delay and improving the circuit performance.

Referring to FIG. 3, the shift register further comprises a tenth transistor M10, an eleventh transistor M11 and a twelfth transistor M12. The gate electrode of the tenth transistor M10 is connected to the first node PD, one of the source electrode and the drain electrode of the tenth transistor M10 is connected to the third node PU, and the other one is connected to the low-level voltage line Vss. The gate electrode of the eleventh transistor M11 is connected to the first node PD, one of the source electrode and the drain electrode of the eleventh transistor M11 is connected to the output terminal OUT, and the other one is connected to the low-level voltage line Vss. The gate electrode of the twelfth transistor M12 is connected to the third node PU, one of the source electrode and the drain electrode of the twelfth transistor M12 is connected to the first node PD, and the other one is connected to the low-level voltage line Vss.

It should be noted that the transistors shown in FIG. 3 are all N-type transistors, that is, they may be formed by the same manufacturing process to reduce the manufacturing cost. Based on different types of transistors, a connection relationship of the source electrode and the drain electrode may be set to match the direction of the current flowing through the corresponding transistor. When the transistor has a structure in which the source electrode and the drain electrode are symmetrical, the source electrode and the drain electrode may be regarded as two electrodes which are not particularly distinguished.

Figure 4:
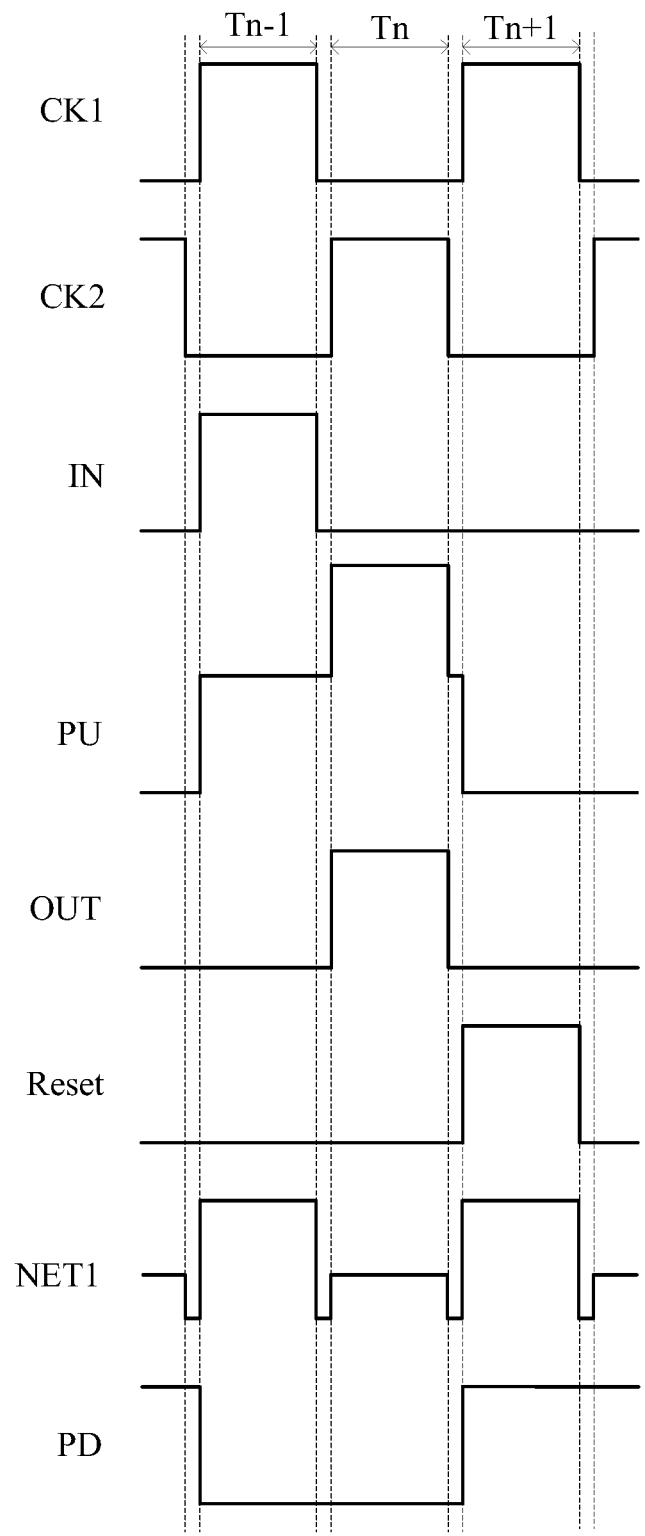
FIG. 4 is a circuit timing sequence diagram of the shift register provided in FIG. 3.

FIG. 4 is the circuit timing sequence diagram of the shift register shown in FIG. 3. Referring to FIG. 4, the operation stages of the shift register mainly include an input period Tn−1, an output period Tn, and a reset period Tn+1. Referring to FIG. 3 and FIG. 4, the operating principle of the shift register is as follows.

Before the input period Tn−1, the circuit structure formed by the first transistor M1, the second transistor M2, the third transistor M3 and the fourth transistor M4 may pull up the electric potential at the first node PD in the third phase III of each clock cycle in accordance with the timing sequence shown in FIG. 2, such that the first node PD remains at a high level all the time. Under the action of the high level at the first node PD, the tenth transistor M10 and the eleventh transistor M11 may maintain the third node PU and the output terminal OUT at a low level provided by the low voltage line Vss, and the shift register will not output a signal.

In the input period Tn−1, the input terminal IN is changed to be at a high level. At this point, the first clock signal line CK1 is at a high level, the second clock signal line CK2 is at a low level, and the fifth transistor M5 and the eighth transistor M8 are turned on, such that the third node PU is pulled up to a high level provided at the input terminal IN. At the same time, the ninth transistor M9 is also turned on, such that the output terminal OUT is maintained at a low level provided by the low-level voltage line Vss. Under the action of the high level at the third node PU, the fourth transistor M4 and the twelfth transistor M12 are turned on, such that the first node PD is forced to be set at a low level provided by the low-level voltage line Vss (which may be achieved, for example, by setting the aspect ratio of the twelfth transistor M12 to be greater than the aspect ratio of the first transistor M1). At the same time, the second clock signal line CK2 is connected to the output terminal OUT. In this period, the two terminals of the second capacitor C2 gain an electric potential difference being approximately equal to Vck at the end of charging.

Between the input period Tn−1 and the output period Tn, the first clock signal line CK1 is changed from a high level to a low level, the fifth transistor M5 and the eighth transistor M8 are turned off to stop the pull-up of the electric potential at the third node PU; the ninth transistor M9 is turned off to stop the pull-down of the electric potential at the output e terminal nd OUT, such that other circuit nodes in the shift register other than the second node NET1 remain original potentials, and the shift register will not output a signal.

In the output period Tn, the first clock signal line CK1 is still at a low level, and the second clock signal line CK2 is changed from a low level to a high level, such that the third node PU jumps to be at a voltage approximately twice the Vck under the charge retention action of the second capacitor C2. Therefore, the fourth transistor M4 operates in the saturation region and pulls up the electric potential at the output terminal OUT with a very large pull-up current, such that the output terminal OUT is quickly set to be at a high level to realize the above-mentioned bootstrapped signal output. During this period, the first node PD is still kept at a low level under the pull-down action of the twelfth transistor M12, and the second node NET1 is set at the initial voltage Vini in the first phase I.

Between the output period Tn and the reset period Tn+1, the second clock signal line CK2 is changed from a high level to a low level, and the electric potential at the third node PU jumps back to the state in the input period Tn−1. The output terminal OUT will be set to be at a low level under the action of the turned-on fourth transistor M4. At the same time, the second node NET1 is lowered at the threshold voltage Vth in the second phase II, that is, the storage of the threshold voltage is completed.

In the reset period Tn+1, the second clock signal line CK2 is still at a low level, the first clock signal line CK1 is changed from a low level to a high level, and the reset terminal Reset is changed to be at a high level, such that the sixth transistor M6 and the seventh transistor M7 are turned on and the level at the third node PU and the level at the output terminal OUT are set to be at a low level provided by the low level voltage line Vss. Thus, the fourth transistor M4 is turned off to cut off the connection between the second clock signal line CK2 and the output terminal OUT; the twelfth transistor M12 is turned off to stop the pull-down of the electric potential at the first node PD. The second node NET1 is set to be at a high-level voltage equal to (Vck+Vth) in the third stage III, such that the first transistor M1 pulls up the first node PD to a high level without being affected by the threshold voltage. Thus, the tenth transistor M10 and the eleventh transistor M11 are turned on, and the third node PU and the output terminal OUT remain at a low level provided by the low-level voltage line Vss. In this stage, the eighth transistor M8 and the ninth transistor M9 are also turned on, such that the third node PU may be maintained at a low level provided at the input terminal IN, and the output terminal OUT is maintained at a low level provided by the low-level voltage line Vss. Under the cooperation of above multiple aspects, the signal resetting is completed at the third node PD and at the output terminal OUT, and the shift register returns to the same operating state as before the input period Tn−1.

It may be seen that a circuit structure of the shift register shown in FIG. 3 may realize the functions thereof under a circuit timing sequence shown in FIG. 4, and may form a gate driver as a repetitive circuit to implement line driver on an array substrate. At the same time, it may be seen that since the gate electrodes of the first transistor M1 and the second transistor M2 are connected to the same signal and have the same threshold voltage, it may be considered that the threshold voltage drift conditions of the first transistor M1 and the second transistor M2 are identical. Therefore, the threshold voltage of the first transistor M1 may be compensated to eliminate the effect of the threshold voltage drift of the first transistor M1 on the electric potential at the first node PD, thereby in favor of resolving the problem of an abnormal output signal. Comparing with the prior art, the embodiment of the present disclosure may improve the stability of the shift register and achieve a better product performance.

Figure 5:
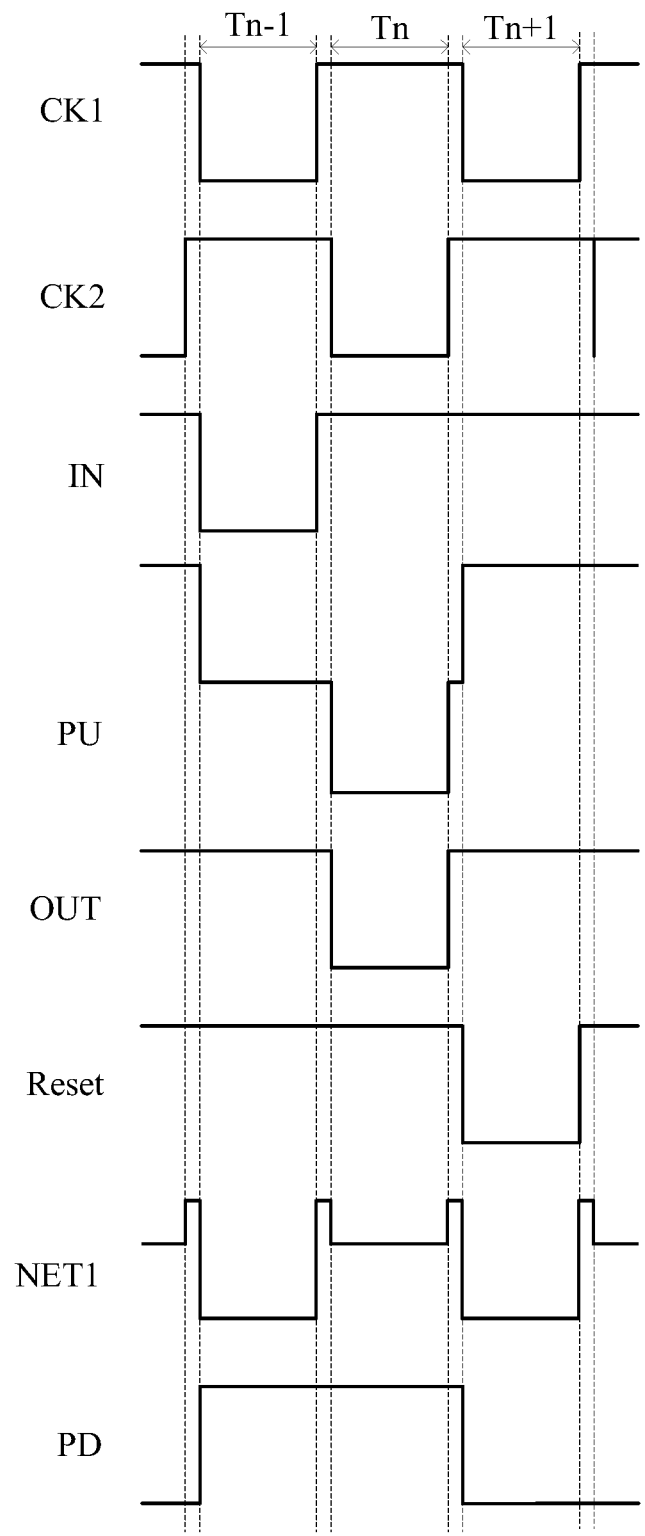
FIG. 5 is a circuit timing sequence diagram of a shift register provided in another embodiment of the present disclosure.

For convenience of understanding, the above embodiments are described with a high level as an effective level and a low level as an ineffective level respectively. Of course, during the implementation, it is also possible to use a low level as an effective level and a high level as an ineffective level. Specifically, the following changes may be made on the basis of the above embodiments: all of the transistors in FIG. 3 are set as P-type transistors; the low-level voltage line Vss is replaced with an ineffective-level voltage line that outputs a high level; a circuit timing sequence shown in FIG. 4 is changed to a circuit timing sequence shown in FIG. 5. It is easy to understand that these changes make a high level in the circuit operating principle changes to a low level, a low level changes to a high level, the electric potential pull-up changes to the electric potential pull-down and the electric potential pull-down changes to the electric potential pull-up, while the essence of the circuit operating principle remains unchanged. Therefore, the changed circuit structure, the changed circuit timing sequence and the changed circuit operating principle may be understood with reference to the above embodiments, and details are not described herein again. It may be seen that the changed shift register may also solve the problem of the abnormal output signal caused by the threshold voltage drift of the first transistor. Comparing with the prior art, the changed shift register may improve the stability of the shift register and achieve a better product performance.

Figure 6:
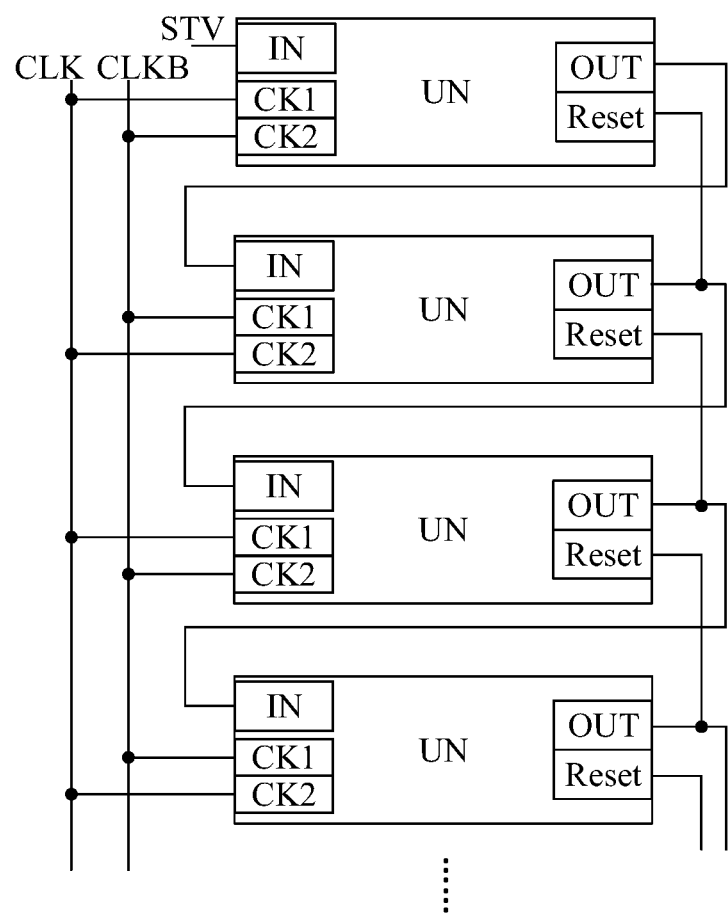
FIG. 6 is a schematic diagram of a connection relationship among shift registers in a gate electrode driving circuit provided in an embodiment of the present disclosure.

Based on the same inventive concept, an embodiment of the present disclosure further provides an array substrate. The array substrate comprises any one of the above-mentioned shift registers. In an example, the array substrate is provided with a plurality of gate electrode driving circuits outside a display area. Each of the gate electrode driving circuits comprises a plurality of stages of any one of the above-mentioned shift registers. FIG. 6 is a schematic diagram of a connection relationship among the shift registers in the gate electrode driving circuit provided by an embodiment of the present disclosure. As shown in FIG. 6 in each gate electrode driving circuit: except for the first stage of shift register UN, the input terminal IN of any stage of shift register UN is connected to the output terminal OUT of the previous stage of shift register UN (the input terminal IN of the first stage of shift register UN is connected to the frame start signal STV); except for the first stage of shift register UN, the output terminal OUT of any stage of shift register UN is connected to the reset terminal Reset of the previous stage of shift register UN. In addition, in order to achieve a correct signal timing sequence, the first clock signal line CK1 to which the odd-numbered stage of shift register UN is connected is the second clock signal line CK2 to which the even-numbered stage of shift register UN is connected, and the second clock signal line CK2 to which the odd-numbered stage of shift register UN is connected is the first clock signal line CK1 to which the even-numbered stage of shift register UN is connected. That is, except for the first stage, the clock signal of any stage of shift register is connected in an opposite way to the previous stage of shift register. For example, the odd-numbered stages of shift registers UN in FIG. 6 respectively use the connected positive-phase clock signal line CLK as the first clock signal line CK1 and use the connected inverted-phase clock signal line CLKB as the second clock signal line CK2; the even-numbered stages of shift registers UN respectively use the connected inverted-phase clock signal line CLKB as the first clock signal line CK1 and the connected positive-phase clock signal line CLK as the second clock signal line CK2. Based on the stability of the shift register, the operating stability of a circuit on the array substrate may be improved and a better product performance may be achieved.

Based on the same inventive concept, an embodiment of the present disclosure further provides a display device including any kind of array substrate. The display device may be a display panel, a mobile phone, a tablet computer, a television, a display, a laptop computer, a digital photo frame, a navigator or any other product or part with a display function. Based on the operating stability of the circuit on the array substrate, the operating stability of the display device may be improved and better product performance may be achieved.

The foregoing are only preferred embodiments of the present disclosure, and are not intended to limit the present disclosure. Within the spirit and principles of the present disclosure, any modifications, equivalent substitutions, improvements, etc., are within the scope of protection of the present disclosure.

What is claimed is:

1. A shift register, comprising:
   a first transistor, wherein one of a source electrode and a drain electrode of the first transistor is connected to a first clock signal line, and the other one is connected to a first node, and a gate electrode of the first transistor is connected to a second node;
   a second transistor, wherein a gate electrode of the second transistor is connected to the second node, one of a source electrode and a drain electrode of the second transistor is connected to the second node, and the other one is connected to the first clock signal line;
   a charging circuitry connected to the second node and a second clock signal line and configured to set the second node to an effective level when the second clock signal line is at an effective level;
   a memory circuitry connected to the second node and the first clock signal line and configured to store a threshold voltage of the second transistor and to compensate a threshold voltage of the first transistor with the stored threshold voltage; wherein,
   the first transistor and the second transistor have the same threshold voltage.

2. The shift register according to claim 1, wherein the memory circuitry is configured to store the threshold voltage of the second transistor when the second node discharges the first clock signal line through the second transistor; and to compensate the threshold voltage of the first transistor with the stored threshold voltage when the first clock signal line changes a level at the first node through the first transistor.

3. The shift register according to claim 1, wherein during the same clock inversion process, a moment when an effective level is changed to an ineffective level on the second clock signal line is earlier than a moment when an ineffective level is changed to an effective level on the first clock signal line.

4. The shift register according to claim 1, wherein the memory circuitry comprises a first capacitor, wherein a first terminal of the first capacitor is connected to the second node, and a second terminal of the first capacitor is connected to the first clock signal line.

5. The shift register according to claim 1, wherein the charging circuitry comprises a third transistor, wherein a gate electrode of the third transistor is connected to the second clock signal line, one of a source electrode and a drain electrode of the third transistor is connected to the second clock signal line, and the other one is connected to the second node.

6. The shift register according to claim 1, further comprising an output terminal, and a third node configured to control signal output; and the shift register further comprising:
   a fourth transistor, wherein a gate electrode of the fourth transistor is connected to the third node, one of a source electrode and a drain electrode of the fourth transistor is connected to the second clock signal line, and the other one is connected to the output terminal.

7. The shift register according to claim 1, further comprising an output terminal and a third node configured to control signal output; and the shift register further comprising:
   a tenth transistor, wherein a gate electrode of the tenth transistor is connected to the first node, one of the source electrode and the drain electrode of the tenth transistor is connected to the third first node, and the other one is connected to an ineffective-level voltage line;
   an eleventh transistor, wherein a gate electrode of the eleventh transistor is connected to the first node, one of a source electrode and a drain electrode of the eleventh transistor is connected to the output terminal, and the other one is connected to the ineffective-level voltage line; and
   a twelfth transistor, wherein a gate electrode of the twelfth transistor is connected to the third node, one of a source electrode and a drain electrode of the twelfth transistor is connected to the first node, and the other one is connected to the ineffective-level voltage line.

8. The shift register according to claim 6, further comprising:
   a second capacitor, wherein a first terminal of the second capacitor is connected to the third node, and a second terminal of the second capacitor is connected to the output terminal.

9. The shift register according to claim 8, further comprising an input terminal, and a reset terminal; and the shift register further comprising:
   a fifth transistor, wherein a gate electrode of the fifth transistor is connected to the input terminal, one of a source electrode and a drain electrode of the fifth transistor is connected to the input terminal, and the other one is connected to the third node;
   a sixth transistor, wherein a gate electrode of the sixth transistor is connected to the reset terminal, one of a source electrode and a drain electrode of the sixth transistor is connected to the third node, and the other one is connected to an ineffective-level voltage line; and
   a seventh transistor, wherein a gate electrode of the seventh transistor is connected to the reset terminal, one of a source electrode and a drain electrode of the seventh transistor is connected to the output terminal, and the other one is connected to the ineffective-level voltage line.

10. The shift register according to claim 9, further comprising:
    an eighth transistor, wherein a gate electrode of the eighth transistor is connected to the first clock signal line, one of a source electrode and a drain electrode of the eighth transistor is connected to the input terminal, and the other one is connected to the third node.

11. The shift register according to claim 10, further comprising:
    a ninth transistor, wherein a gate electrode of the ninth transistor is connected to the first clock signal line, one of a source electrode and a drain electrode of the ninth transistor is connected to the output terminal, and the other one is connected to the ineffective-level voltage line.

12. The shift register according to claim 11, further comprising:
    a tenth transistor, wherein a gate electrode of the tenth transistor is connected to the first node, one of the source electrode and the drain electrode of the tenth transistor is connected to the third node, and the other one is connected to the ineffective-level voltage line;
    an eleventh transistor, wherein a gate electrode of the eleventh transistor is connected to the first node, one of a source electrode and a drain electrode of the eleventh transistor is connected to the output terminal, and the other one is connected to the ineffective-level voltage line; and
    a twelfth transistor, wherein a gate electrode of the twelfth transistor is connected to the third node, one of a source electrode and a drain electrode of the twelfth transistor is connected to the first node, and the other one is connected to the ineffective-level voltage line.

13. The shift register according to claim 1, wherein the first clock signal line and the second clock signal line are each loaded with one of a positive-phase clock signal and an inverted-phase clock signal respectively.

14. An array substrate, comprising a shift register, wherein the shift register comprises:
a first node configured to control signal resetting;
a first transistor, wherein a gate electrode of the first transistor is connected to a second node, one of a source electrode and a drain electrode of the first transistor is connected to a first clock signal line, and the other one is connected to the first node;
a second transistor, wherein a gate electrode of the second transistor is connected to the second node, one of a source electrode and a drain electrode of the second transistor is connected to the second node, and the other one is connected to the first clock signal line;
a charging circuitry connected to the second node and a second clock signal line and configured to set the second node to an effective level when the second clock signal line is at an effective level;
a memory circuitry connected to the second node and the first clock signal line and configured to store a threshold voltage of the second transistor, and to compensate a threshold voltage of the first transistor with the stored threshold voltage; wherein,
the first transistor and the second transistor have the same threshold voltage.

15. A display device, comprising the array substrate according to claim 14.

16. The array substrate according to claim 14, wherein the memory circuitry is configured to store the threshold voltage of the second transistor when the second node discharges the first clock signal line through the second transistor; and to compensate the threshold voltage of the first transistor with the stored threshold voltage when the first clock signal line changes a level at the first node through the first transistor.

17. The array substrate according to claim 14, wherein during the same clock inversion process, a moment when an effective level is changed to an ineffective level on the second clock signal line is earlier than a moment when an ineffective level is changed to an effective level on the first clock signal line.

18. The array substrate according to claim 14, wherein the memory circuitry comprises a first capacitor, wherein a first terminal of the first capacitor is connected to the second node, and a second terminal of the first capacitor is connected to the first clock signal line.

19. The array substrate according to claim 14, wherein the charging circuitry comprises a third transistor, wherein a gate electrode of the third transistor is connected to the second clock signal line, one of a source electrode and a drain electrode of the third transistor is connected to the second clock signal line, and the other one is connected to the second node.

20. The array substrate according to claim 14, wherein the first clock signal line and the second clock signal line are each loaded with one of a positive-phase clock signal and an inverted-phase clock signal respectively.

* * * * *